(12) United States Patent
Liu et al.

(10) Patent No.: US 8,071,416 B2
(45) Date of Patent: Dec. 6, 2011

(54) METHOD OF FORMING A UNIFORM COLOR FILTER ARRAY

(75) Inventors: Saijin Liu, Boise, ID (US); Ulrich C. Boettiger, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 961 days.

(21) Appl. No.: 11/505,308

(22) Filed: Aug. 17, 2006

(65) Prior Publication Data

US 2008/0122960 A1     May 29, 2008

(51) Int. Cl.
    *H01L 21/00*     (2006.01)
(52) U.S. Cl. ............... 438/70; 438/29; 438/34; 438/35; 438/69; 257/E31.121; 257/E31.127; 348/273; 349/106
(58) Field of Classification Search ............ 438/29, 438/34, 35, 69, 70; 257/E31.121, E31.127; 349/106; 348/273
See application file for complete search history.

(56) References Cited

U.S. PATENT DOCUMENTS

| | | | | |
|---|---|---|---|---|
| 5,650,867 | A | * | 7/1997 | Kojima et al. ............ 349/104 |
| 5,677,202 | A | * | 10/1997 | Hawkins et al. ............ 438/70 |
| 6,285,065 | B1 | * | 9/2001 | Levy ............ 257/440 |
| 6,383,694 | B1 | | 5/2002 | Wu et al. |
| 6,529,239 | B1 | | 3/2003 | Dyck et al. |
| 6,566,151 | B2 | | 5/2003 | Yeh et al. |
| 6,657,755 | B1 | * | 12/2003 | Campbell ............ 358/514 |
| 6,729,945 | B2 | | 5/2004 | Xu et al. |
| 6,956,253 | B2 | | 10/2005 | Weng et al. |
| 7,365,298 | B2 | | 4/2008 | Ryu |
| 2002/0086457 | A1 | | 7/2002 | Grimsley |
| 2002/0130992 | A1 | | 9/2002 | Huang |
| 2005/0233493 | A1 | * | 10/2005 | Augusto ............ 438/51 |
| 2006/0038252 | A1 | * | 2/2006 | Mouli ............ 257/446 |
| 2006/0114377 | A1 | * | 6/2006 | Yen et al. ............ 349/106 |
| 2006/0138500 | A1 | * | 6/2006 | Kim ............ 257/294 |
| 2006/0146376 | A1 | * | 7/2006 | Kim ............ 358/482 |
| 2007/0158772 | A1 | | 7/2007 | Boettiger |
| 2008/0017945 | A1 | | 1/2008 | Wu et al. |
| 2008/0116537 | A1 | | 5/2008 | Adkisson et al. |
| 2008/0117319 | A1 | | 5/2008 | Jiang et al. |

OTHER PUBLICATIONS

Hocheol Lee, et al., Planarization of a CMOS die for an integrated metal MEMS, Proceedings of SPIE vol. 4979 (2003).

* cited by examiner

*Primary Examiner* — Evan Pert
*Assistant Examiner* — Eduardo A Rodela
(74) *Attorney, Agent, or Firm* — Dickstein Shapiro LLP

(57) ABSTRACT

A method of forming a uniform color filter array. In one embodiment, a first compensation layer is formed over a non-planar color filter array and is patterned to form material structures. A second compensation layer is blanket deposited over the first layer. A technique, such as etching or polishing, is then performed to remove the first and second compensation layers, creating a substantially planar color filter array surface. In another embodiment, the planar color filter array is formed in a recessed trench.

30 Claims, 10 Drawing Sheets

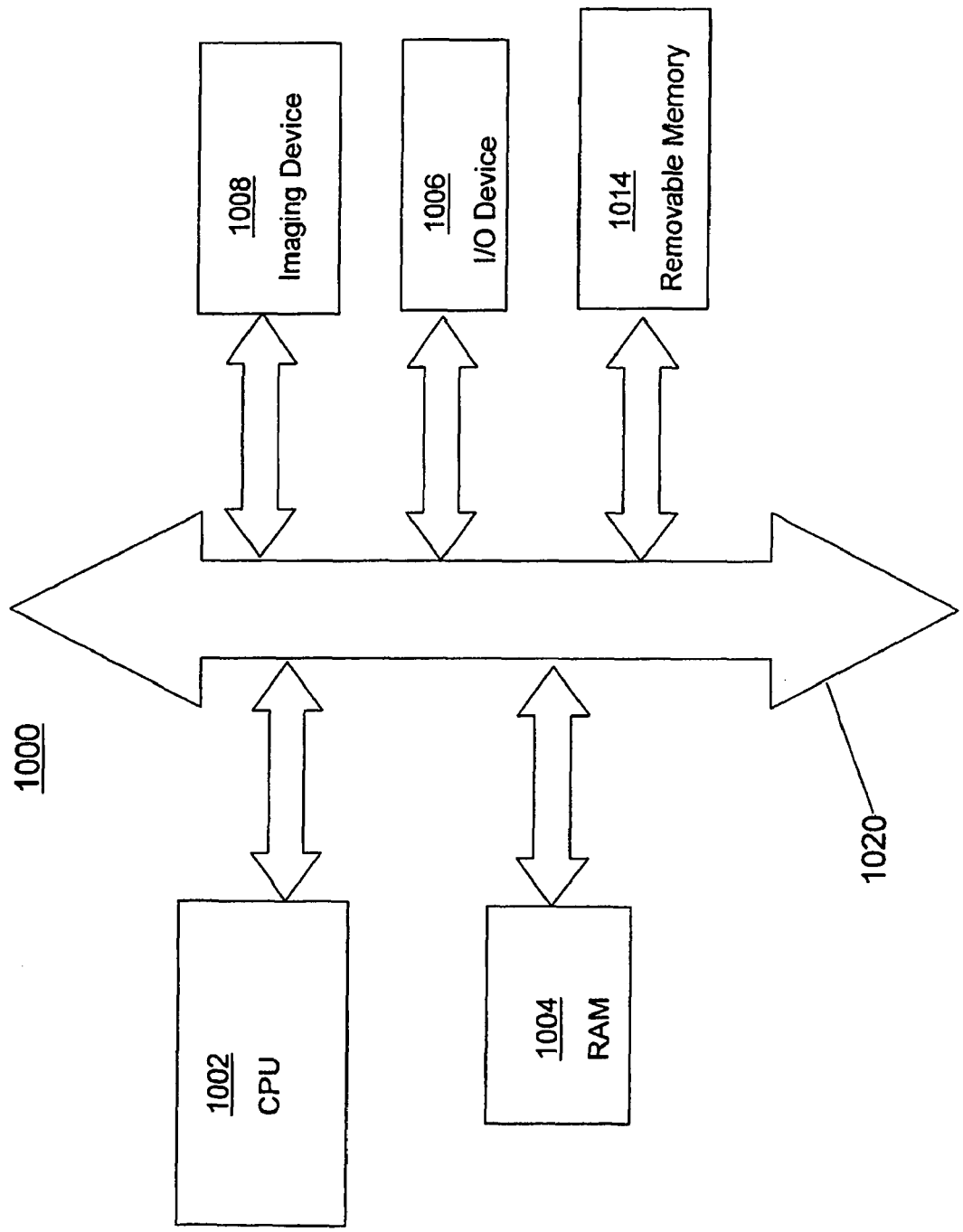

METHOD OF FORMING A UNIFORM COLOR FILTER ARRAY

FIELD OF THE INVENTION

Embodiments of the present invention relate to the field of imaging devices, and in particular, to the use of color filters in connection with imaging devices.

BACKGROUND OF THE INVENTION

There are a number of different types of semiconductor-based imaging devices including charge coupled devices (CCD's), photodiode arrays, charge injection devices (CID's), hybrid focal plane arrays, and complementary metal oxide semiconductor (CMOS) imagers. Current applications of solid-state imaging devices include cameras, scanners, machine vision systems, vehicle navigation systems, video telephones, computer input devices, surveillance systems, auto focus systems, star trackers, motion detector systems, image stabilization systems, and other image acquisition and processing systems.

Solid state imaging devices include an array of pixel cells, which converts light energy received through an optical lens into electrical signals. Each pixel cell contains a photosensor for converting a respective portion of a received image into an electrical signal. The electrical signals produced by the array of photosensors are processed to render a digital image.

Imaging device pixel cells are sensitive to light in the visible spectrum. Naturally, however, the pixel cells used in digital imaging are essentially black and white (light and dark) images. To capture color images, the spectral components of incident light must be separated and collected. To this end, multiple band-pass color filters are imposed in front of the image sensor cells over the photosensitive areas of the cells. Color filters are typically pigmented or dyed material that will only pass a narrow band of visible light, e.g., red, blue, or green. For most low cost CMOS or CCD imaging devices, the color filters are integrated with the pixel cells in a patterned array. A common example of a color filter pattern is the tiled color filter array illustrated in U.S. Pat. No. 3,971,065, and commonly referred to as "the Bayer pattern" color filter. The color filters allow what would otherwise be black and white image sensors to produce color images.

As shown in FIG. 1, the Bayer pattern 15 is an array of repeating red (R), green (G), and blue (B) filters. Half of the filters in the Bayer pattern 15 are green, like green filter 3, while one quarter are red and the other quarter are blue. As shown, the pattern 15 repeats a row of alternating red and green color filters followed by a row of alternating blue and green color filters.

The Bayer patterned filters (or other patterns) may be deposited on top of an array of pixel cells 22 in the manner shown in FIG. 2. Specifically, an array of pixel cells 22 is formed in a semiconductor substrate 10. Each of the pixel cells 22 has a photosensitive element 12, which may be any photon-to-charge converting device, such as a photogate, photoconductor or photodiode. The color filter array 15 is typically formed over a metal layer 18 in the imager 20, separated from the photosensitive element 12 by insulating layers like an interlevel dielectric layer (ILD) 14 and a passivation layer 16. The metal layer 18 may be opaque and used to shield the area of the pixel cells 22 that is not intended to be light sensitive. Convex lenses 21 are formed over the color filter array 15. In operation, incident light is focused by the lenses 21 through the filter array 15 to the appropriate photosensitive element 12.

One problem associated with conventional color filter arrays is illustrated in FIG. 3. As shown, a color filter array 99 often has a non-uniform surface. This variation can be caused, for example, by the inherent non-uniformity caused by spin-coating the color filter array material on any surface of the imager 20. In fact, it can be seen in FIG. 3 that the surface unevenness occurs in two ways: (1) within an individual color filter and (2) among color filters within the array.

The first variation, i.e., variations within one color filter, is shown in FIG. 3 at pixel 51, which has a severe dip in the material used for the individual color filter. Specifically, the material has a greater thickness at the edges for this pixel than it does in the center. This type of variation in the color filter material surface is most common in the color filters formed during the latter part of the color filter array formation. Specifically, the first color filters formed on a flat surface can typically achieve sufficiently even surfaces; however, those filters formed after the first color filters are in place may exhibit unevenness due to the thickness variation achieved during reflow of the material. The variation of material thickness within any one color filter may be as great as 2000 Angstroms, depending on the particular characteristics of the color filter material.

Conventional color filter arrays 99 may also suffer from non-uniformity across the surface of the entire array (i.e., variation among pixel sensor cells within one die). This phenomenon is illustrated by dashed line 103 on FIG. 3, where the height of the color filters near the center of the array (HCA) may be greater than the height of the color filters near either outside end of the array (HEA). Within one die, this pixel-to-pixel variation can be caused by resist flow-over during processing of the color filter material causing the non-uniform distribution of color filter material. The across-array surface unevenness may have a variation of about 400-500 Angstroms of height differential from the center to sides of the array.

The surface unevenness can cause problems for an imaging device 20 (FIG. 2) having the uneven color filter array. For example, an uneven surface does not create a solid foundation for a microlens array, which is typically constructed over the color filters, and is less stable with an uneven foundation. In addition, an uneven color filter array can cause imaging efficiency reduction by creating additional fixed pattern noise or a shading effect. Specifically, fixed pattern noise, which is a spatial variation in pixel output values under uniform illumination, results from the variation of color filter material within one pixel cell. An undesirable shading effect occurs as the result of non-planarity of the color filter array over the entire surface of the array. Thus, having an color filter array with even topography can advantageously help to create a solid foundation for microlenses, reduce fixed pattern noise, and decrease undesirable shading of a reproduced image.

A conventional technique for dealing with the uneven topography of color filter arrays is to form an additional planarization layer over the surface of the color filter array, and use the flat planarization layer as a flat surface for the formation of microlenses. This additional planarization layer, however, adds to the stack height of the imaging device, disadvantageously resulting in additional space between the microlenses and the photosensor below.

In addition, known methods for providing even surfaces in semiconductor integrated circuit processing may not be effective for dealing with the uneven surface in a color filter array. Specifically, both chemical mechanical polishing (CMP) and etching techniques utilize reference surfaces to remove unwanted materials. For example, if etching were performed on the color filter array 99 of FIG. 3, the result would likely be that a uniform amount of thickness would be removed from each of the color filters, leaving the overall surface uneven. The lack of a planar reference surface makes these known techniques ineffective, and does not rectify the additional problems with uneven color filters discussed above.

Accordingly, a color filter array having an even surface and a simple and effective method of forming the same are desired.

BRIEF DESCRIPTION OF THE DRAWINGS

FIG. 10 shows a processor system incorporating at least one imaging device constructed in accordance with an embodiment of the invention.

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized, and that structural, logical and electrical changes may be made without departing from the spirit and scope of the present invention.

The term "pixel" or "pixel sensor cell," as used herein, refers to a photo-element unit cell containing a photosensor device and associated structures for converting photons to an electrical signal. For purposes of illustration, a single representative three-color pixel array is illustrated in the figures and description herein. However, the technqiues described herein may be applied to monochromatic imagers as well as to imagers for sensing fewer than three, more than three, or a different three color components in an array. For example, the disclosed embodiments are equally applicable for cyan, magenta, and yellow (CMY) color filters rather than RGB filters described below. Accordingly, the following detailed description is not to be taken in a limiting sense, and the scope of the present invention is defined only by the appended claims.

Figure 1:
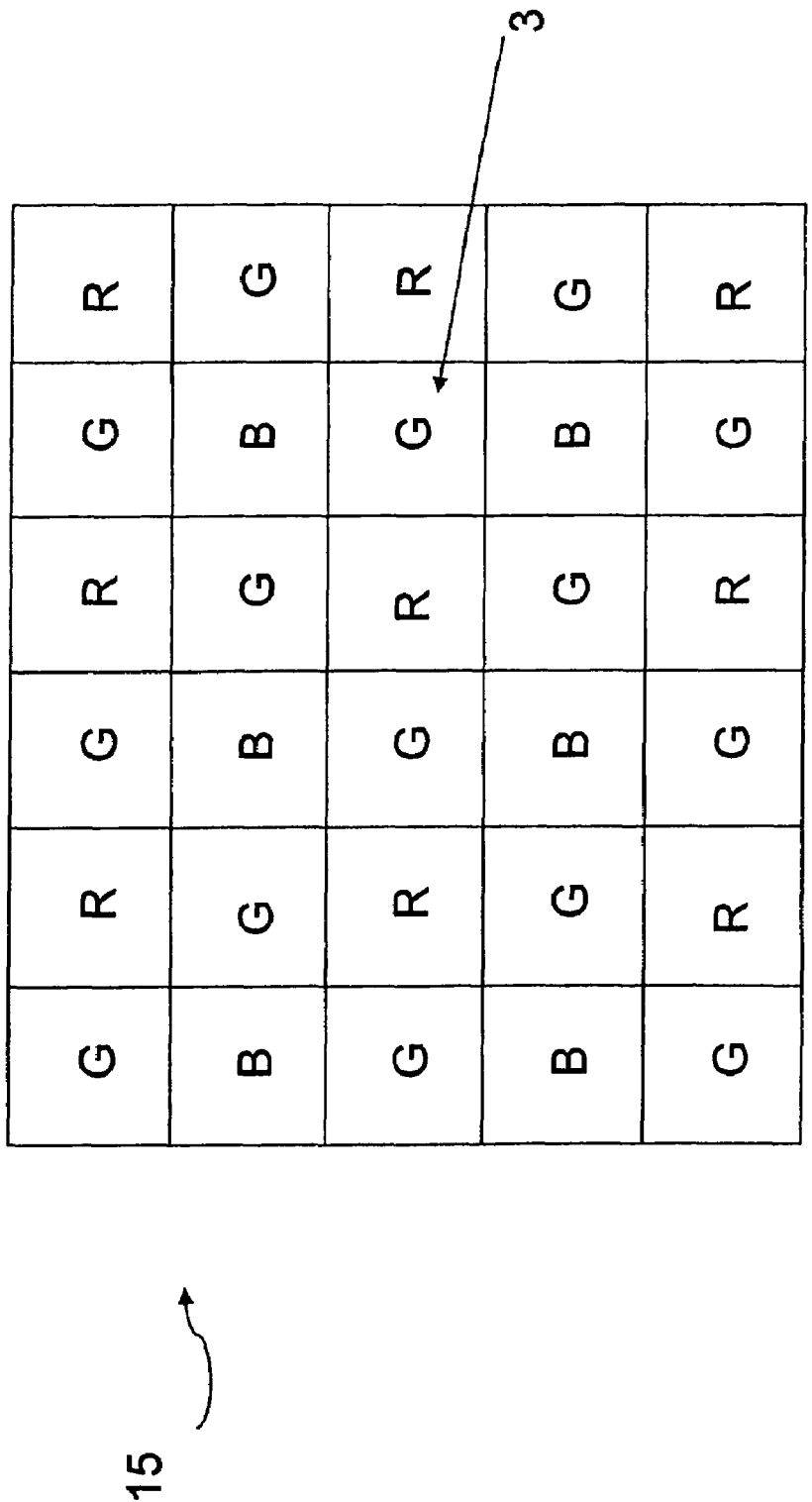
FIG. 1 is a top-down illustration of a conventional color filter array.
Figure 2:
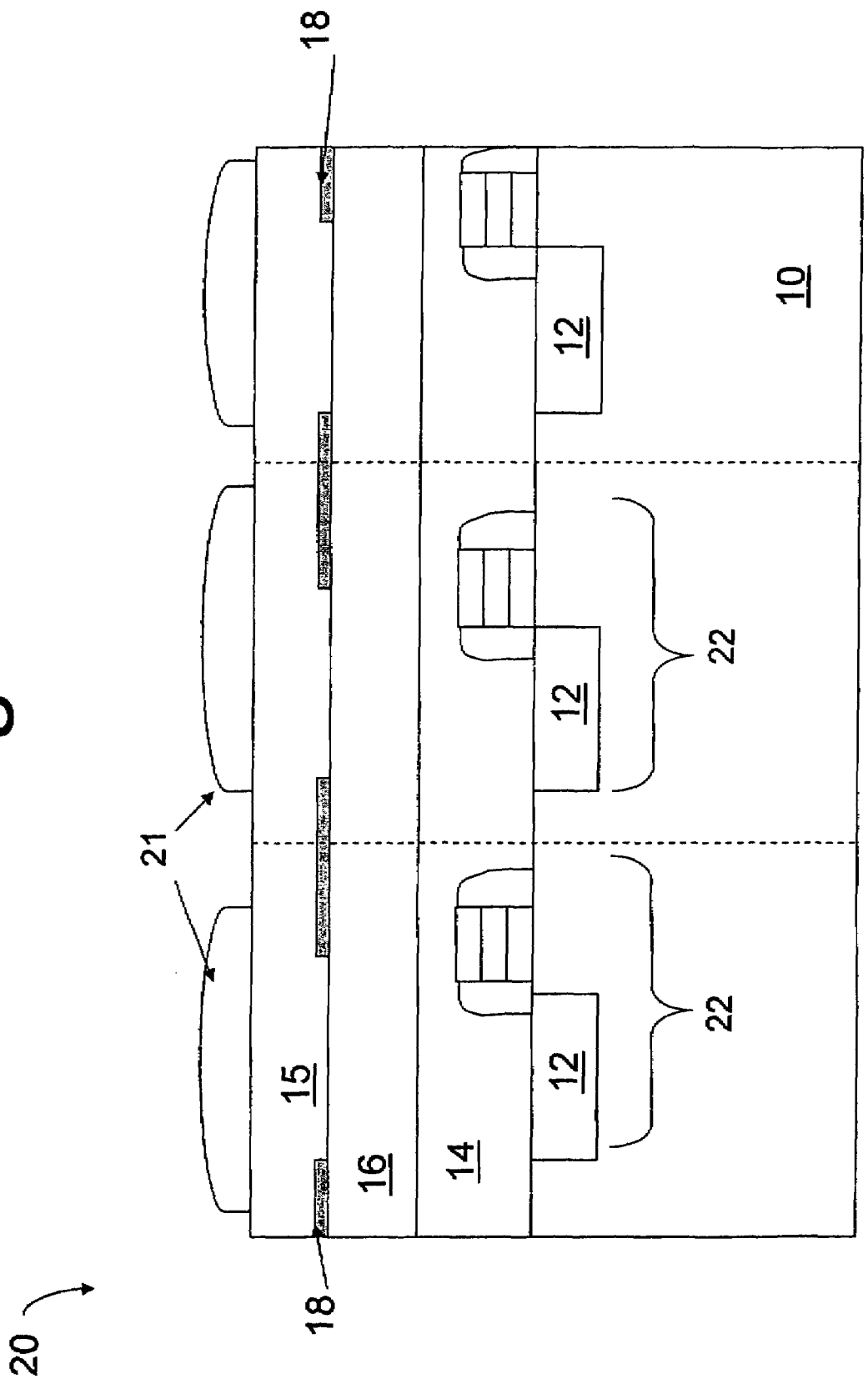
FIG. 2 is a cross-sectional view of a portion of an imaging device utilizing the color filter array of FIG. 1.

In addition, it should be understood that, taken alone, a pixel generally does not distinguish one incoming color of light from another and its output signal represents only the intensity of light received, not any identification of color. However, pixels 22 (FIG. 2), as discussed herein, are referred to by color (i.e., "red pixel," "blue pixel," etc.) when a color filter 15 (FIGS. 1 and 2) is used in connection with the pixel to focus a particular wavelength range of light, corresponding to a particular color, onto the pixel. FIG. 1 depicts a conventional color filter array 15, arranged in a Bayer pattern, covering a pixel array to focus the incoming light thereat. Accordingly, when the term "red pixel" is used herein, it is referring to a pixel with a red (R) color filter. Filters of other colors similarly filter wavelength ranges corresponding to the color to which they refer.

Figure 6:
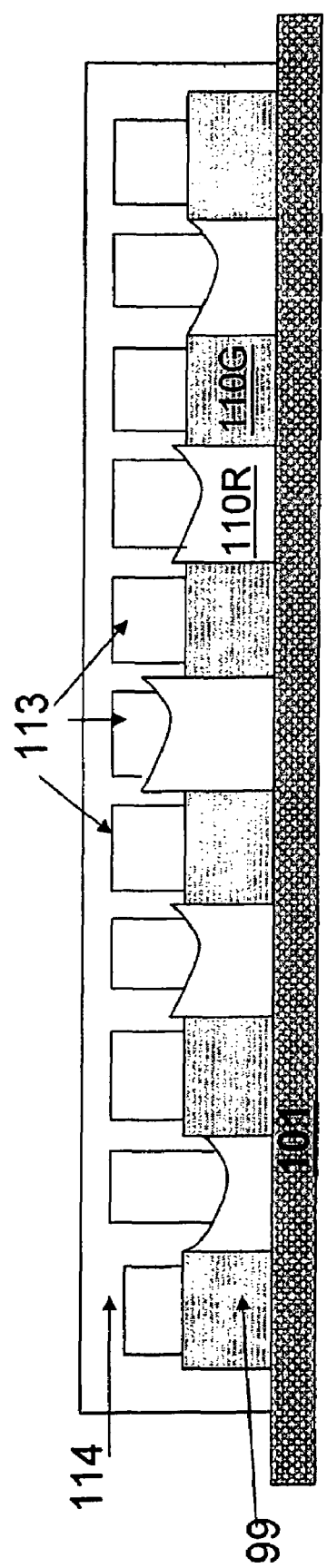
FIG. 6 is a is a cross-sectional view illustrating an example of a color filter array at a stage of processing subsequent to that shown in FIG. 5.
Figure 7:
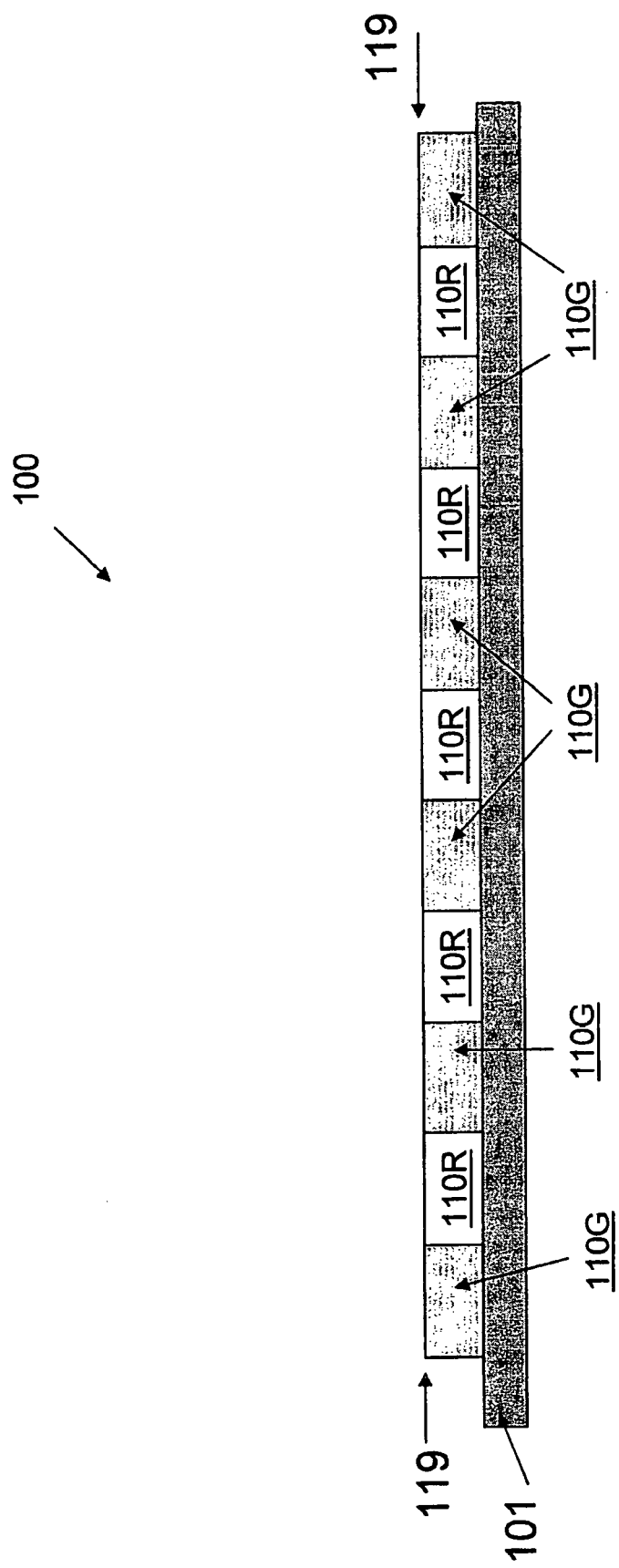
FIG. 7 is a is a cross-sectional view illustrating an example of a color filter array at a stage of processing subsequent to that shown in FIG. 6.

Referring now to the drawings, where like elements are designated by like reference numerals, FIG. 7 illustrates a cross-sectional view of an example of a color filter array 100 constructed in accordance with the one embodiment. The color filter array 100 has a plurality of color filters, such as red color filters 110R and green color filters 110G, arranged in a Bayer pattern on a substrate 101. One row of the color filter array 100 is shown, which is a row of alternating red and green color filters 110R and 110G, respectively. Rows, such as that shown here would alternate with rows of blue and green color filters (not shown) in a repeating pattern. The color filters 110R, 110G of the array 100 have a substantially planar surface 119. Thus, unlike the conventional color filter array 99 shown in FIG. 3, each of the color filters 110R, 110G have a common thickness across the individual filter and among each filter 110R, 110G in the array 100. The color filter array 100 can be formed in accordance with the method described herein with reference to FIGS. 3-7.

Figure 3:
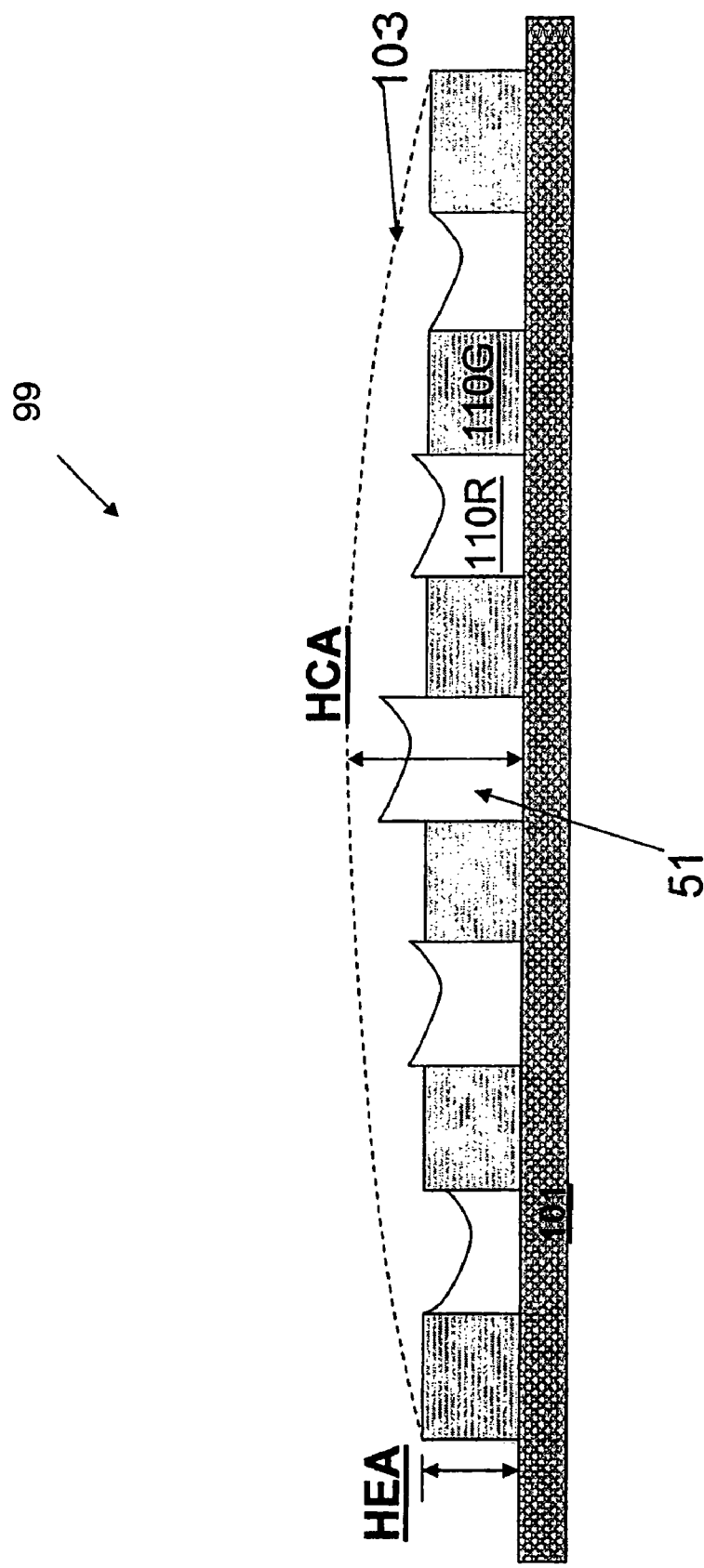
FIG. 3 is a cross-sectional view of a conventional color filter array.

Shown in FIG. 3 is a conventional color filter array 99, which can be the starting point for a method of forming a color filter array in accordance with an embodiment. Therefore, known processing steps, such as spin-coating and/or reflowing color filter array materials on the surface of a substrate 101 can be performed prior to the additional steps described below. In addition, it should be understood that the substrate 101 may be one or more layers in an imaging device, such as a metallization layer 18, an inner layer dielectric 16, or a passivation layer 16 (FIG. 2), each of which may be formed over a semiconductor substrate 10 having structure and circuitry formed thereon.

Figure 4:
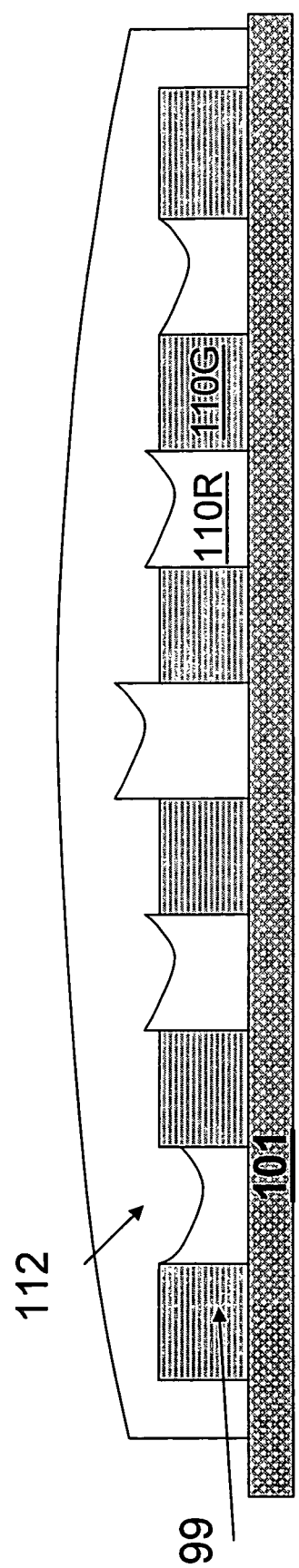
FIG. 4 is a cross-sectional view illustrating an example of a color filter array at a stage of processing in accordance with an embodiment of the present disclosure.

As shown in FIG. 4, a first compensating layer 112 is formed over the surface of the color filter array 99. The first compensating layer 112 may be formed of any desirable material, including known i-line photoresists. In one embodiment, the first compensating layer 112 has an etch- or polish-rate that is very similar, if not identical, to that of the color filter array material for the underlying array 99. The first compensating layer 112 can be comparable in thickness to the variation of thickness in any one color filter or variation experienced across the array. Thus, the first compensating layer 112 may be formed in the range of about 400 to about 2500 Angstroms thick over the color filter array 99.

In some instances, where perfect planarity is not required, and in order to eliminate unnecessary processing, the first compensating layer 112 may be sufficient to create a planar reference surface for a subsequent CMP or etch-back processing to result in a substantially planar color filter array 100. In most instances, however, this first compensating layer 112 is typically not sufficient to create substantial planarity (which may be defined for purposes of this disclosure as sufficient to provide an acceptable planarity for the geometries, materials and operations of the imaging device) and further processing is needed to increase the planarity, as is now described. In current embodiments, a deviation of no more than 3% deviation from a planar surface is considered to provide substantial planarity.

Figure 5:
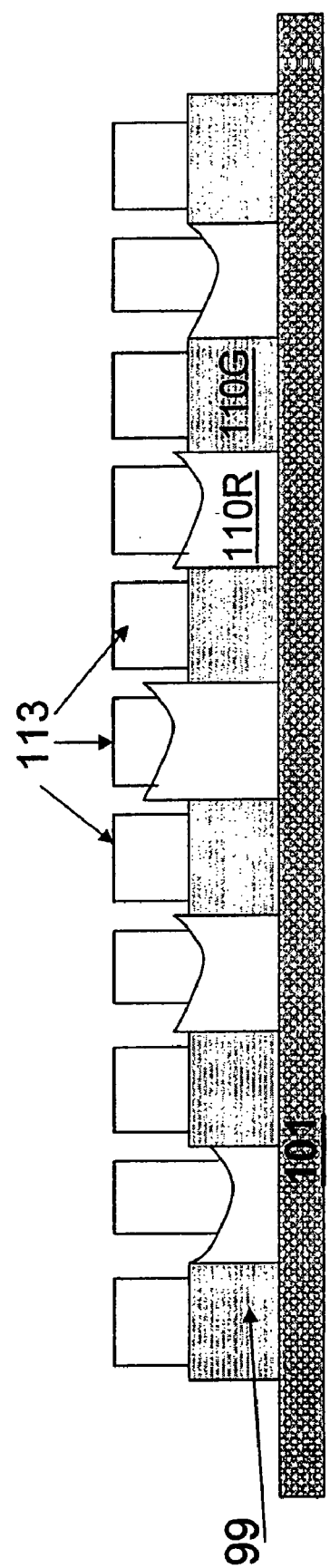
FIG. 5 is a cross-sectional view illustrating an example of a color filter array at a stage of processing subsequent to that shown in FIG. 4.

Next, as shown in FIG. 5, the first compensating layer 112 is patterned to form a series of material structures 113 over the individual color filters of underlying array 99. The patterned, material structures 113 have different pattern densities at different locations in the array, as can be seen in both width and height dimension. In fact, the material structures 113 may have a varying thickness within an individual structure 113 and have varying thicknesses and widths of the material that forms the structures 113 when comparing one structure to others in the array. The different pattern densities of the material structures 113 assist in the planarization performed in subsequent processing steps. Generally, the density of the material structures 113 in the center of the array—particularly over the second set of formed color filters 110R—should be lower, and the density of the material structures increases toward the edges of the array. The varying densities of the material structures 113, thus, make a more planar top surface.

The planarity of the top surface of the material structures 113 across the array can be improved at this point by use of a resist reflow step. This means that the first compensating layer 112 material is heated above the glass transition temperature for the resist prior to the step of patterning to create the material structures 113. This critical reflow temperature will vary depending on the material selected for the first compensating layer 112, but may be within the range of about 110° C. to about 180° C. It may be necessary to hold the material at this critical temperature for a short period of time, such as e.g., half a minute, to ensure that the desired reflow takes place.

As shown in FIG. 6, a second compensating layer 114 is formed over the material structures 113 and underlying, uneven color filter array 99. The second compensating layer 114 can be formed by blanket depositing, for example, by spin-coating the compensating material over these surfaces. The material used may be the same for the first and second compensating layers 112, 114. The second compensating layer 114 may be formed with a thickness across the array of about 1500 to about 10,000 Angstroms.

It may be beneficial if the materials utilized for the first and second compensating layers 112, 114 have a common etch or polish rate as the rate of the color resist materials that comprise the color filters in array 99. A common etch or polish rate permits planarizing the underlying color array 99 in one step, thereby eliminating the possibility of re-introducing non-uniformity during the etch or polishing step. The second compensating material may, however, be formed of a different material, that has other advantageous properties such as e.g., low viscosity, or is otherwise a good planarizing material.

Patterning of the second compensating layer 114 is not necessary as the second layer provides the planarizing benefits of a flowing liquid interacting with the topography of the first compensating layer structures 113. Upon formation of the second compensating layer 114, the surface of the layer 114 should be substantially planar across the array 100. There should be relatively little, if any, variation in the surface level anywhere in the array (either associated with one color filter or among more than one filter). The resist viscosity and spin conditions for forming the second compensating layer 114 should be chosen to optimize the planarity of the final surface.

Next, as shown in FIG. 7, a step for removing the first and second compensating layers 112, 114 is performed, utilizing the planar surface of the second compensating layer 114 as a reference surface to make the surface 119 of the color filter array 100 substantially planar. This step can be performed using known techniques for removing resist materials, including but not limited to, wet etching, dry etching, masked etching, and chemical mechanical polishing (CMP).

It should also be noted, however, that additional compensation layers can be formed upon the second compensating layer 114. The disclosed embodiments are not limited by the number or type of compensating layers formed over the uneven color filter array 99. Thus, although the embodiments have been described with reference to a first, patterned compensating layer 112 and a second, blanket compensating layer 114, more or fewer layers formed in other ways are also feasible.

Figure 8:
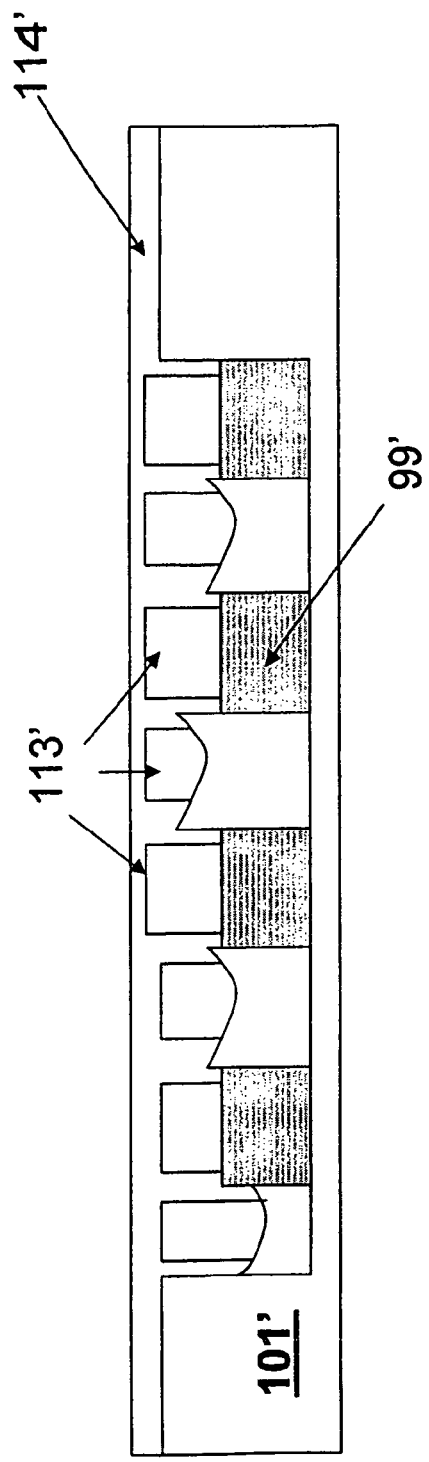
FIG. 8 is a cross-sectional view illustrating an example of a color filter array at an stage of processing in accordance with a second embodiment of the disclosure.

In accordance with a second embodiment, color filter arrays are formed in a recessed surface, such as color filters formed in a trench in one or more material layers, as described in U.S. application Ser. No. 11/328,152, also assigned to Micron Technology, Inc. and incorporated herein by reference in its entirety. As shown in FIG. 8, an uneven color filter array 99' can be formed as described above, except within a trench of a substrate 101', rather than on a top surface thereof. Thereafter, the steps described above with reference to FIGS. 4-6 can be followed to form a first compensation layer on the uneven surface for the color filter array 99', which is patterned to form material structures 113' over the individual filters. Next, a second compensation layer 114' is formed by blanket deposition over the entire surface. As shown, the second compensation layer 114' may be formed to coat a top surface of the substrate 101' as well as the structures 113' in the trench.

Figure 8A:
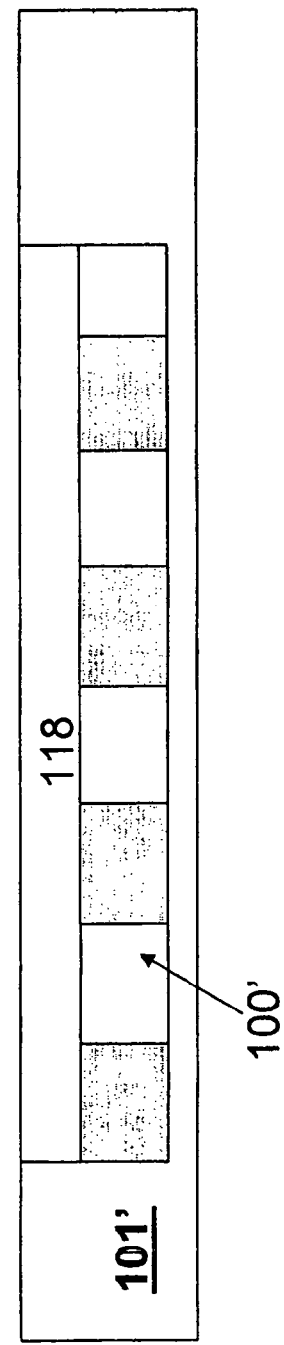
FIG. 8A is a cross-sectional view illustrating an example of a color filter array constructed in accordance with a second embodiment of the present disclosure.

As shown in FIG. 8A, an etching step would be performed as described above with reference to FIG. 7, to form an even color filter array 100' in a substrate trench. Preferably, the first compensating layer patterned structures 113', the second compensating layer 114' and the uneven color filters 99' would have a similar etch rate, sufficiently identical such that this etching process is performed effectively in one step. The color filter array 100' can thereafter be covered with a planarization layer 118, as shown, such that the planarization layer 118 has a top surface that is even with a top surface of the layer 101'. Alternatively, microlenses can be formed directly on the planar filter array 99', which may be below the surface of the trench in layer 101'. This color filter array 100' has the benefit of overall minimal stack height.

Figure 9:
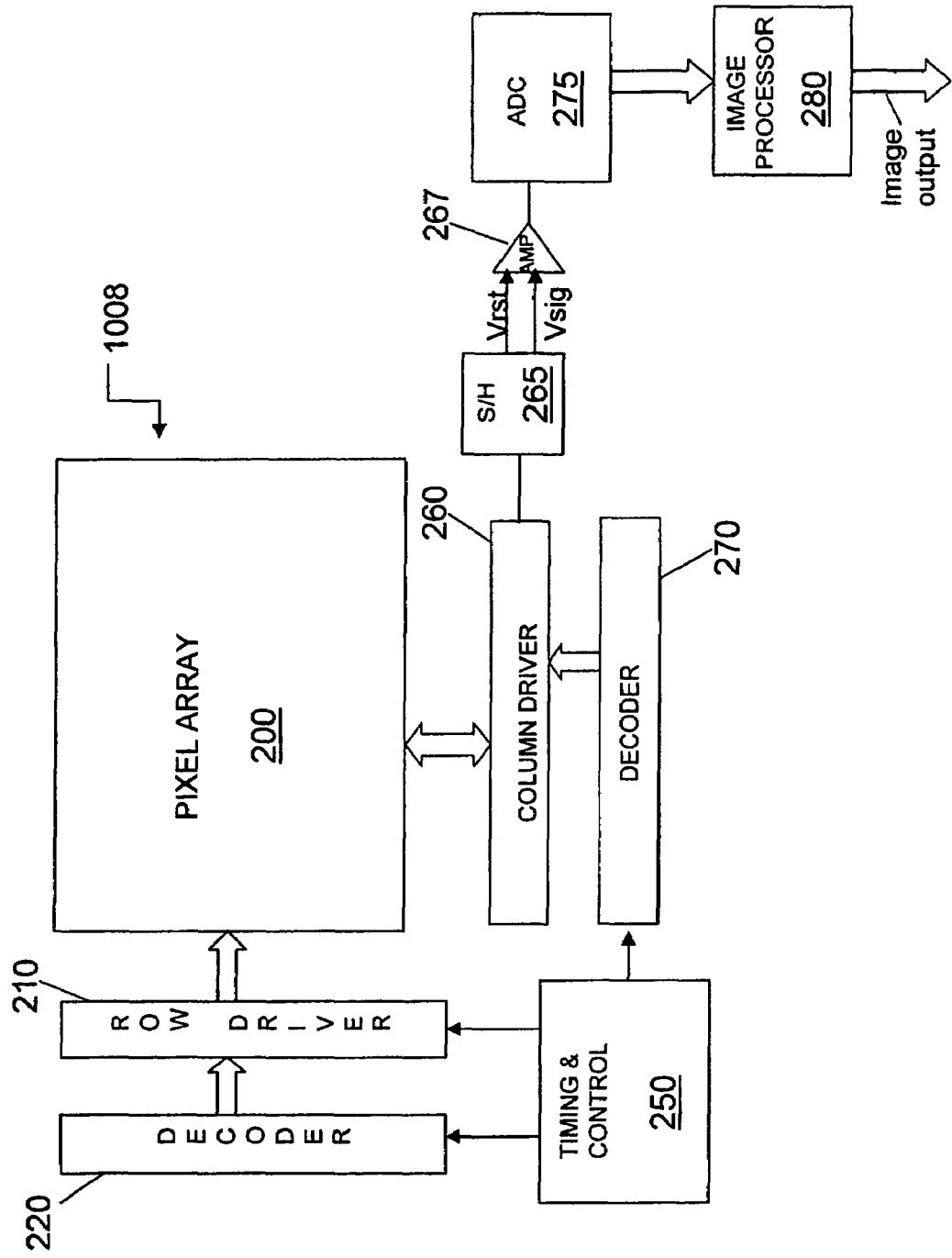
FIG. 9 shows a block diagram of an imaging device constructed in accordance with an embodiment of the present disclosure.

FIG. 9 illustrates a block diagram of a CMOS imaging device 1008 having a pixel array 200 containing one of the color filter arrays 100, 100', described above. Pixel array 200 comprises a plurality of pixels cells arranged in a predetermined number of columns and rows (not shown). The pixel cells of each row in array 200 are all turned on at the same time by a row select line, and the pixel cells of each column are activated by respective column select lines to output signals onto column lines. A plurality of row select, column select, and column lines are provided for the entire array 200. The row lines are selectively activated in sequence by a row driver 210 in response to row address decoder 220. The column select lines are selectively activated in sequence for each row activation by a column driver 260 in response to column address decoder 270. Thus, a row and column address is provided for each pixel cell.

The CMOS imager 1008 is operated by a control circuit 250, which controls address decoders 220, 270 for selecting the appropriate row and column lines for pixel readout. Control circuit 250 also controls the row and column driver circuitry 210, 260 so that they apply driving voltages to the drive transistors of the selected row and column lines. The pixel output signals typically include a pixel reset signal Vrst taken off of a floating diffusion region when it is reset by the reset transistor and a pixel image signal Vsig, which is taken off the floating diffusion region after photo-generated charges are transferred to it. The Vrst and Vsig signals are read by a sample and hold circuit 265 and are subtracted by a differential amplifier 267, to produce a differential signal Vrst–Vsig for each pixel. Vrst–Vsig represents the amount of light impinging on the pixels. This difference signal is digitized by an analog-to-digital converter 275. The digitized pixel signals are fed to an image processor 280 to form a digital image output. The digitizing and image processing can be located on or off the imager chip. In some arrangements the differential signal Vrst–Vsig can be amplified as a differential signal and directly digitized by a differential analog to digital converter.

FIG. 10 shows a system 1000, a typical processor system modified to include an imaging device 1008 (FIG. 9) described above. The processor system 1000 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, an image stabilization system.

System 1000, for example a still or video camera system, generally comprises a central processing unit (CPU) 1002, such as a microprocessor, that communicates with input/output (I/O) devices 1006 over a bus 1020. Imaging device 1008 also communicates with the CPU 1002 over the bus 1020. The processor-based system 1000 also includes random access memory (RAM) 1004, and can include removable memory 1014, such as flash memory, which also communicates with the CPU 1002 over the bus 1020. The imaging device 1008 may be combined with a processor, such as a CPU, digital signal processor, or microprocessor, with or without memory storage on a single integrated circuit or on a different chip than the processor.

It should be understood that other methods of processing the color signals produced from a device using color filter arrays 100, 100' may be used. As such, the above description and drawings are only to be considered illustrative of exemplary embodiments. Modification of, and substitutions to, specific process conditions, materials and structures can be made.

What is claimed as new and desired to be protected by Letters Patent of the United States is:

1. A method of forming a color filter array, comprising the acts of:
    depositing a first color filter material to form a plurality of first color filters on a surface;
    depositing a second color filter material to form a plurality of second color filters on the surface;
    depositing a first compensation layer to cover the top of each of the plurality of first and second color filters;
    depositing a second compensation layer over and in contact with the first compensation layer; and
    forming a substantially planar color filter array by removing the first compensation layer, the second compensation layer, and at least a portion of the plurality of first and second color filters.

2. The method of claim 1, wherein the surface is a top surface of a metallization layer.

3. The method of claim 1, wherein the surface is a trench bottom of a trench formed in a material layer over a semiconductor substrate.

4. The method of claim 1, wherein removing the compensation layer comprises one of etching or polishing.

5. The method of claim 1, wherein at least one of an etch rate and a polish rate of the first and second color filter materials is common to that of the compensation layer.

6. The method of claim 1, further comprising patterning the first compensation layer to form a patterned structure over the plurality of first and second color filters.

7. The method of claim 6, wherein the act of patterning comprises forming a plurality of material structures having different densities over the color filters.

8. The method of claim 6, wherein depositing the first compensation layer comprising forming the layer having a thickness in the range of about 400 to about 2500 Angstroms thick.

9. The method of claim 8, wherein depositing the first compensation layer comprising forming the layer having a thickness in the range of about 1500 to about 10000 Angstroms thick.

10. The method of claim 1, further comprising heating the deposited compensation layer to at least a glass transition temperature for the compensation layer.

11. The method of claim 1, wherein depositing the compensation layer comprises spin-coating a layer of resist over the surface and the plurality of first and second color filters.

12. A method of forming an imager comprising:
    forming a plurality of pixels having photosensors;
    forming an array of color filters, each filter being formed over a respective one of the photosensors, wherein the color filters each have a top surface and at least a portion of one or more color filter is not substantially planar;
    forming a first compensation layer over the top of the array of color filters;
    patterning the first compensation layer to form material structures over at least some of the color filters;
    forming a second compensation layer over and in contact with the first compensation layer; and
    removing the first and second compensation layers.

13. The method of claim 12, wherein the second compensation layer is blanket deposited between and over the patterned structures.

14. The method of claim 12, wherein forming the first compensation layer comprises forming the layer having a thickness in the range of about 400 to about 2500 Angstroms.

15. The method of claim 14, wherein forming the second compensation layer comprises forming the second layer having a thickness in the range of about 1500 to about 10000 Angstroms thick.

16. The method of claim 12, wherein forming an array of color filters comprises forming a plurality of red, green, and blue filters formed in a repeating Bayer pattern sequence.

17. The method of claim 12, wherein the first compensation layer, second compensation layer, and color filters have a common etch rate or a polish rate.

18. The method of claim 17, wherein removing the first and second compensation layers comprises one of etching or polishing.

19. The method of claim 18, wherein etching or polishing further comprises removing at least a portion of some of the color filters in the array.

20. A method of forming a pixel cell of an image device, the method comprising the steps of:
    forming a plurality of fabricated layers over a photo-conversion device;

forming a trench in at least one of the plurality of fabricated layers;
    forming a color filter in a lower portion of the trench, the color filter comprising a first plurality of color filters having a first color and a second plurality of color filters having a second color different from the first color;
    forming a first compensation layer over the top of the first plurality of color filters and over the top of the second plurality of color filters;
    patterning the first compensation layer to form a material structure over the first plurality of color filters and the second plurality of color filters;
    forming a second compensation layer over the first plurality of color filters and the second plurality of color filters; and
    removing the first and second compensation layers after forming the second compensation layer,
    whereby the method results in a substantially planar color filter.

21. The method of claim 20, further comprising filling the trench with a material layer over the substantially planar color filter.

22. The method of claim 21, further comprising polishing the material layer so that a top surface of the material layer is planar with a top surface of the at least one fabricated layer.

23. A method of forming a color filter array comprising:
    forming a first set of color filters having a first color, forming a second set of color filters having a second color, and forming a third set of color filters having a third color, wherein the first, second, and third colors are each different from each other, wherein each color filter has a top surface, and wherein the top surfaces of at least some of the filters of the first set of color filters are non-planar;
    forming a first material layer over the top of the first set of color filters, over the top of the second set of color filters, and over the top of the third set of color filters, wherein the first material layer has a varying thickness above at least some of the filters of the first set of color filters; and
    planarizing the top surfaces of the color filters utilizing the first material layer as a reference surface.

24. The method of claim 23, wherein the thickness of the first material layer is greater near an edge of the first material layer than it is near a center of the first material layer.

25. The method of claim 23, further comprising patterning the first material layer and forming a second blanket-deposited material layer over the first material layer.

26. A method of forming a planar surface in an imager device comprising:
    forming a first plurality of color filters from a first material, at least some of the first plurality of color filters having an uneven top surface;
    forming a second plurality of color filters from a second material;
    forming a third plurality of color filters from a third material, wherein the first, second, and third materials are each different colors;
    forming a first compensating layer over the first, second, and third pluralities of color filters;
    patterning the first compensating layer to form a series of patterned structures over the first, second, and third pluralities of color filters, at least some of the structures having varying densities; and
    forming a second compensating layer having a substantially planar top surface over and between the series of patterned structures.

27. The method of claim 26, wherein the density of the patterned structures near a center of the array has a lower density than the density of the structures located at an edge of the first material layer.

28. The method of claim 26, further comprising etching the first and second compensating layers, using the substantially planar top surface as a reference surface.

29. The method of claim 26, further comprising chemical mechanical polishing the first and second compensating layers, using the substantially planar top surface as a reference surface.

30. The method of claim 28, wherein the first, second, and third materials, and the first and second compensating layers have a common etch rate.

* * * * *